(12) United States Patent
Tshagharyan et al.

(10) Patent No.: US 12,094,548 B1
(45) Date of Patent: Sep. 17, 2024

(54) DIAGNOSING FAULTS IN MEMORY PERIPHERY CIRCUITRY

(71) Applicant: Synopsys, Inc., Sunnyvale, CA (US)

(72) Inventors: Grigor Tshagharyan, Yerevan (AM); Gurgen Harutyunyan, Yerevan (AM); Yervant Zorian, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/134,198

(22) Filed: Apr. 13, 2023

(51) Int. Cl.
  *G11C 29/10* (2006.01)
  *G11C 7/06* (2006.01)
  *G11C 7/22* (2006.01)

(52) U.S. Cl.
  CPC ............... *G11C 29/10* (2013.01); *G11C 7/22* (2013.01); *G11C 7/06* (2013.01)

(58) Field of Classification Search
  CPC ............. G11C 29/10; G11C 7/22; G11C 7/06
  See application file for complete search history.

(56) References Cited

U.S. PATENT DOCUMENTS

| 2005/0028066 A1* | 2/2005 | Raahemi | H04L 1/0057 |
| | | | 714/758 |
| 2015/0220395 A1* | 8/2015 | Bueb | G06F 11/1076 |
| | | | 714/764 |
| 2023/0185664 A1* | 6/2023 | Chung | G06F 3/064 |
| | | | 365/201 |

* cited by examiner

Primary Examiner — Thien Nguyen
(74) Attorney, Agent, or Firm — Patterson + Sheridan, LLP

(57) ABSTRACT

Methods for diagnosing faults in memory periphery circuitry, computer readable media, and a test device for the same are provided. In one example, method is provided that includes receiving, at a test device, a first test syndrome from a memory device, the first test syndrome corresponds to a first test process executed by the memory device, wherein the memory device comprises a memory array and peripheral circuitry, and wherein the first test process is associated with a first circuit element of the peripheral circuitry; determining, by a processing device of the test device, a first fault associated with the first circuit element based on the first test syndrome; and diagnosing, by the processing device, the first fault to determine positional information of the first fault, the positional information is associated with the first circuit element.

20 Claims, 13 Drawing Sheets

Test Process

⇑(W(CH));
⇑(R(CH), W(~CH), R(~CH));
⇑(R(~CH), W(CH), R(CH));
⇓(R(CH), W(~CH), R(~CH));
⇓(R(~CH), W(CH), R(CH));
⇑(R(CH));

where:

CH — is physical checkerboard background pattern;
~CH — is inverse physical checkerboard background pattern;
⇑ — is increasing linear addressing direction;
⇓ — is decreasing linear addressing direction.

400

| Syndrome | Fault |
|---|---|
| 000010100 on wordline 0 & 001000000 or 100000000 on the other wordlines & All data bits fail for each failing word | Wordline 0 is SA1 |
| 101000000 on wordline n-1 & 000000100 or 000010000 on the other wordlines & All data bits fail for each failing word | Wordline n-1 is SA1 |
| 101010100 on wordline i & 001000000 or 100000000 on the i+1 to n-1 wordlines & 000000100 or 000010000 on the 0 to i-1 wordlines & All data bits fail for each failing word | Wordline i is SA1 |
| 000010000 or 000000100 on wordline i & 101000000 on wordline i+1 & All data bits fail for each failing word | Wordline i activates i-th & i+1-th rows simultaneously |
| 101000000 on wordline i & 100000000 or 001000000 on wordline i+1 & All data bits fail for each failing word | Wordline i+1 activates i-th & i+1-th rows simultaneously |
| 000010100 on wordline i & 101000000 on wordline i+1 & All data bits fail for each failing word | Either row i or row i+1 is activated by both wordlines i & i+1 |
| XX0110100 on wordline 0 & All data bits fail for each failing word | Wordline 0 is SA0 |
| 101001010 on wordline n-1 & All data bits fail for each failing word | Wordline n-1 is SA0 |
| 101010100 on wordline i & All data bits fail for each failing word | Wordline i is SA0 |

FIG. 4

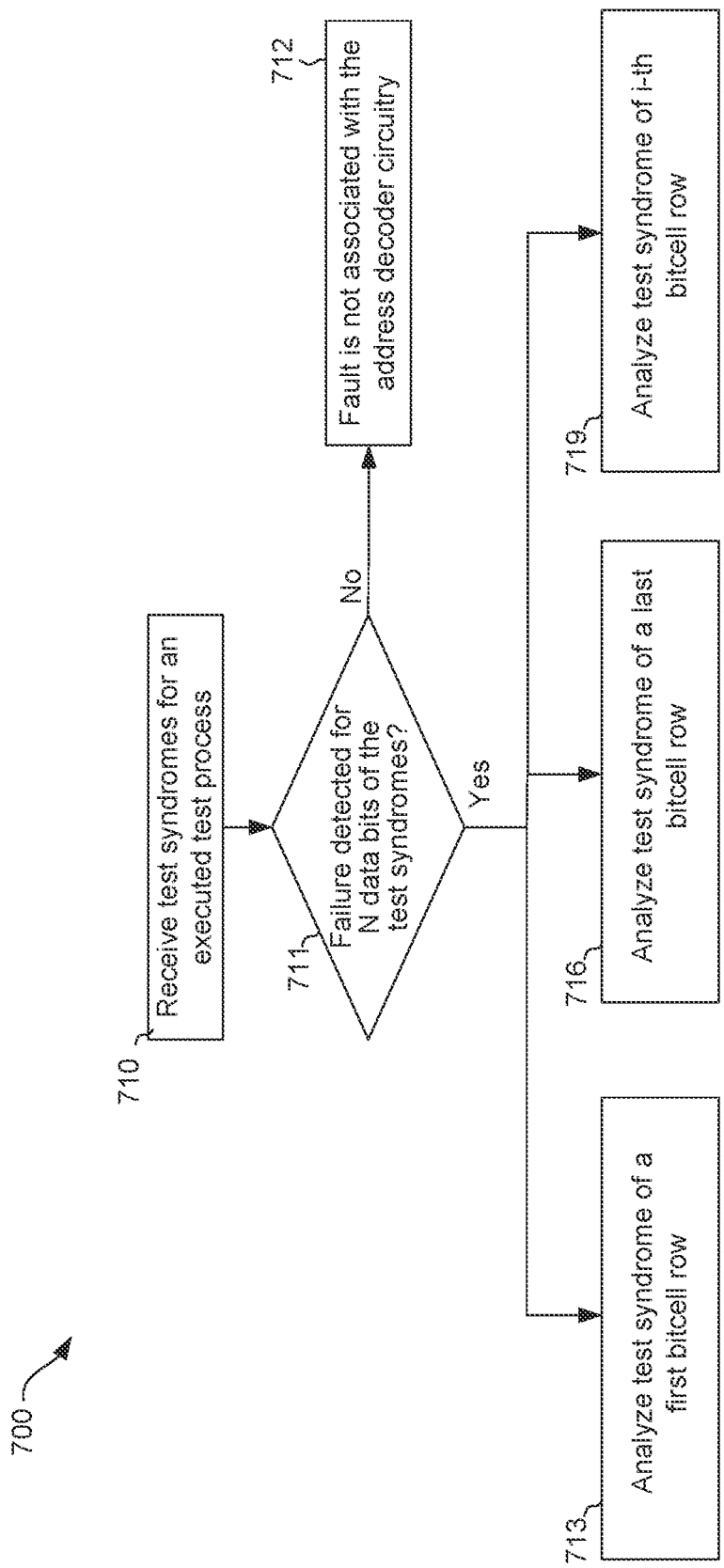

719

Analyze test syndrome of "i" bitcell row

720

Determine a SA1 defect associated with a wordline associated with the i bitcell row and report associated position information based on a test syndrome of the i bitcell row being 101010100, the test syndromes of the "i+1" to "t-1" bitcell rows being 001000000 or 100000000, and the test syndromes of the 0 to "i-1" rows being 000000100 or 000010000

721

Determine a 1W2R defect and report associated position information based on the test syndrome of the "i" bitcell row being 000010000 or 000000100, and the test syndrome of the "i+1" bitcell row is 101000000

722

Determine, for an "i+1" bitcell row, a 1W2R defect and report associated position information based on the test syndrome of the "i" bitcell row being 101000000, and the test syndrome of the "i+1" bitcell row is 100000000 or 001000000

723

Determine, for an "i+1" bitcell row, a 1R2W defect and report associated position information based on the test syndrome of the "i" bitcell row being 000010100, and the test syndrome of the "i+1" bitcell row is 101000000

724

Determine, for the "i" bitcell row, a SA0 defect and report associated position information based on the test syndrome of the "i" bitcell row being 101010100

DIAGNOSING FAULTS IN MEMORY PERIPHERY CIRCUITRY

TECHNICAL FIELD

The present disclosure relates to diagnosing faults within a memory device, and, in more particular, detecting and locating faults within the peripheral circuitry of a memory device.

BACKGROUND

In many integrated circuit (IC) devices, memory devices cover most of the area, and therefore, are the major contributors to the overall yield of the IC devices. To detect failures within the memory devices, test algorithms are applied to built-in self-test (BIST) systems. A test algorithm applies patterns of memory write commands and memory read commands to memory addresses within a memory device. The read data (e.g., test syndromes) includes the effects of errors within the memory device. Accordingly, the read data is used to detect if failures occur within a memory array of the memory device or the peripheral circuitry of the memory device.

SUMMARY

Methods for diagnosing faults in memory periphery circuitry, computer readable media, and a test device for the same are provided. In one example, a method is provided that includes receiving, at a test device, a first test syndrome from a memory device, the first test syndrome corresponds to a first test process executed by the memory device, the memory device includes a memory array and peripheral circuitry, and the first test process is associated with a first circuit element of the peripheral circuitry; determining, by a processing device of the test device, a first fault associated with the first circuit element based on the first test syndrome; and diagnosing, by the processing device, the first fault to determine positional information of the first fault, the positional information is associated with the first circuit element.

In another example, a test device is provided. The test device includes a memory storing instructions, and a processing device coupled with the memory and configured to execute the instructions. The instructions when executed, cause the processing device to: output a first test process to a memory device, the memory device includes a memory array and peripheral circuitry, the first test process is associated with a first circuit element of the peripheral circuitry, and the first test process is executed by the peripheral circuitry and memory to generate a first test syndrome; receive the first test syndrome from the memory device; determine a first fault associated with the first circuit element based on a comparison of the first test syndrome to test syndromes; and diagnose the first fault to determine positional information of the first fault based on location information of the memory array and the peripheral circuitry.

In another example, a non-transitory computer readable medium that includes stored instructions is provided. The stored instructions, which when executed by a processor, cause a processor to: receive a first test syndrome from a memory device, the first test syndrome corresponds to a first test process executed by the memory device, the memory device includes a memory array and peripheral circuitry, and the first test process is associated with a first circuit element of the peripheral circuitry; determine a first fault associated with the first circuit element based on the first test syndrome; and diagnose the first fault to determine positional information of the first fault, the positional information is associated with the first circuit element.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4 illustrates a test syndrome table for a test process in accordance with some embodiments of the present disclosure.

FIGS. 7A, 7B, 7C, AND 7D illustrate flowcharts of a method for diagnosing a fault in accordance with some embodiments of the present disclosure.

DETAILED DESCRIPTION

Figure 1:
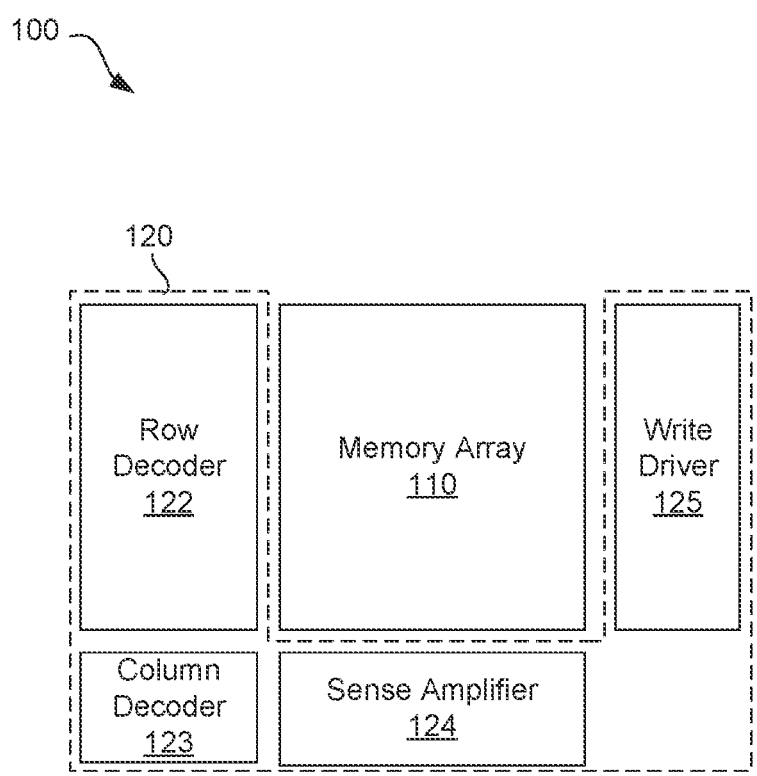
FIG. 1 illustrates a block diagram of a memory device in accordance with some embodiments of the present disclosure.

Aspects of the present disclosure relate to diagnosing faults in memory periphery circuitry.

An integrated circuit (IC) device includes a memory array that is driven by periphery circuitry. Test processes (e.g., test algorithms) are used to detect faults (e.g., errors) within the memory array and/or periphery circuitry. In one or more examples, as the technology processes of the IC devices scale down in size, the memory devices become more densely packed, and detecting the location of a fault within the memory array and periphery circuitry increases in difficulty.

Various test processes are used with built-in self-test (BIST) circuitry to detect faults within a memory array. Executing a test process includes applying patterns of memory write commands and memory read commands to locations within the memory array. Whether the source of the fault (e.g., physical defect) is within the memory array or in the surrounding peripheral circuitry, the effect of the fault propagates to the memory array and is detected within the read data (e.g., test syndrome). While a test process is used to detect a fault that propagates from the memory array, locating the fault within the memory array and/or the peripheral circuitry is difficult, making it also difficult to determine the cause of the fault. Accordingly, much time is spent diagnosing the cause of a fault, increasing the manufacturing time and cost of the corresponding IC device. Further, in some implementations, physical failure analysis processes are used to determine a cause of a failure within the memory array of an IC device. However, such physical failure analysis processes are expensive and time consuming to perform.

The diagnostic process described herein not only detects a fault, but also the location of the fault with reference to the periphery circuitry and memory array. In one example, test processes are generated and applied to a memory device (e.g., a memory array and peripheral circuitry). The test processes are used to detect faults within the peripheral circuitry and diagnose the faults. Test syndromes are generated by the memory read commands of a test process, and are compared to a table of test syndromes to determine the type of fault and a location of a fault along a boundary between the peripheral circuitry and the memory array. In one example, the diagnosis is a two-phase process. In the first phase, the type of the fault is identified from a test syndrome. In a second phase, the fault location is determined within the peripheral circuitry based on the size parameters of the peripheral circuitry and memory array.

Technical advantages of the present disclosure include, but are not limited to, detecting and diagnosing faults within the peripheral circuitry of a memory device to determine a location of a fault. The location of the fault can be used as an indication as to where an error in the corresponding circuit design exists. Accordingly, the manufacturing time used to locate an error is reduced, improving yield of the corresponding IC devices, reducing the manufacturing costs of the IC devices, and improving time-to-market margin for the IC devices.

FIG. 1 illustrates memory device 100, according to one or more examples. The memory device 100 includes a memory array 110 and peripheral circuitry 120. The memory device 100 is an IC device. Further, the memory device 100 includes one or more chips. In one example, the memory device 100 is a system-on-chip (SoC).

The memory array 110 includes bitcells, wordlines, and bitlines. The bitcells are connected to the wordlines and the bitlines. In one example, each bitcell is connected to a wordline and one or more bitlines. In one example, the wordlines are disposed over a first orientation (e.g., horizontally) across the memory array and the bitlines are disposed over a second orientation (e.g., vertically) across the memory array. Each bitcell includes one or more transistors. A first transistor is coupled to one of the wordlines, and a second transistor is connected to one of the bitlines. In one example, a third transistor of each bitcell is connected to another one of the bitlines.

The bitcells of the memory array 110 are selected by activating corresponding wordlines. Further, the bitcells of the memory array 110 are read from and written to via activated corresponding bitlines.

The peripheral circuitry 120 is connected to the memory array 110. Further, the peripheral circuitry 120 selects bitcells of the memory array 110, drives a voltage onto the selected bitcells to update the selected bitcells based on a memory write command, or reads a voltage from the selected bitcells based on a memory read command. In one example, the peripheral circuitry 120 receives a memory read command, determines which bitcell to select from the memory read command, activates a corresponding wordline and one or more bitlines, and reads a voltage associated with the selected bitcell via a corresponding one or more bitlines. The peripheral circuitry 120 receives a memory write command, determines which bitcell to select from the memory write command, activates a corresponding wordline and one or more bitlines, and writes a voltage to selected bitcell via a corresponding one or more bitlines.

The peripheral circuitry 120 includes row decoder circuitry 122, column decoder circuitry 123, sense amplifier circuitry 124, and write driver circuitry 125. The row decoder circuitry 122 and the column decoder circuitry 123 may be referred to collectively as address decoder circuitry. In other examples, the peripheral circuitry 120 may include other circuit elements, and/or omit one or more of the circuit elements illustrated in FIG. 1.

In one example, the row decoder circuitry 122 and the column decoder circuitry 123 receive a memory command, decode the memory address to determine a target bitcell or bitcells. In one example, the row decoder circuitry 122 decodes the address into a row address of the target bitcell or bitcells, and the column decoder circuitry 123 decodes the address into a column address of the target bitcell or bitcells. For a memory read command, one or more of the row decoder circuitry 122 and the column decoder circuitry 123 provides an indication to the sense amplifier circuitry 124 to perform a read operation. For a memory write command, the one or more of the row decoder circuitry 122 and the column decoder circuitry 123 provides an indication to the write driver circuitry 125 to perform a write operation.

The row decoder circuitry 122 is connected to the wordlines of the memory array 110 and activates a wordline to select a bitcell to be read from or written to. The column decoder circuitry 123 is connected to the bitlines of memory array 110, and couples a bitline or bitlines to the sense amplifier circuitry 124 to perform a read operation or the write driver circuitry 125 to perform a write operation.

The sense amplifier circuitry 124 reads a voltage from a selected bitcell. In one example, the sense amplifier circuitry 124 is connected to multiplexers (or other selection circuitry). Each multiplexer is connected to two or more of the bitlines. The column decoder circuitry 123 provides a control signal to the multiplexers, controlling the multiplexers to select one or more of the bitlines. The sense amplifier circuitry 124 reads a voltage from the activated bitcell associated with the selected bitlines.

The write driver circuitry 125 writes a voltage to a selected bitcell. In one example, the write driver circuitry 125 is connected to the multiplexers (or the other selection circuitry). The write driver circuitry 125 writes a voltage to the activated bitcell associated with the bitlines selected by the multiplexers.

Figure 2:
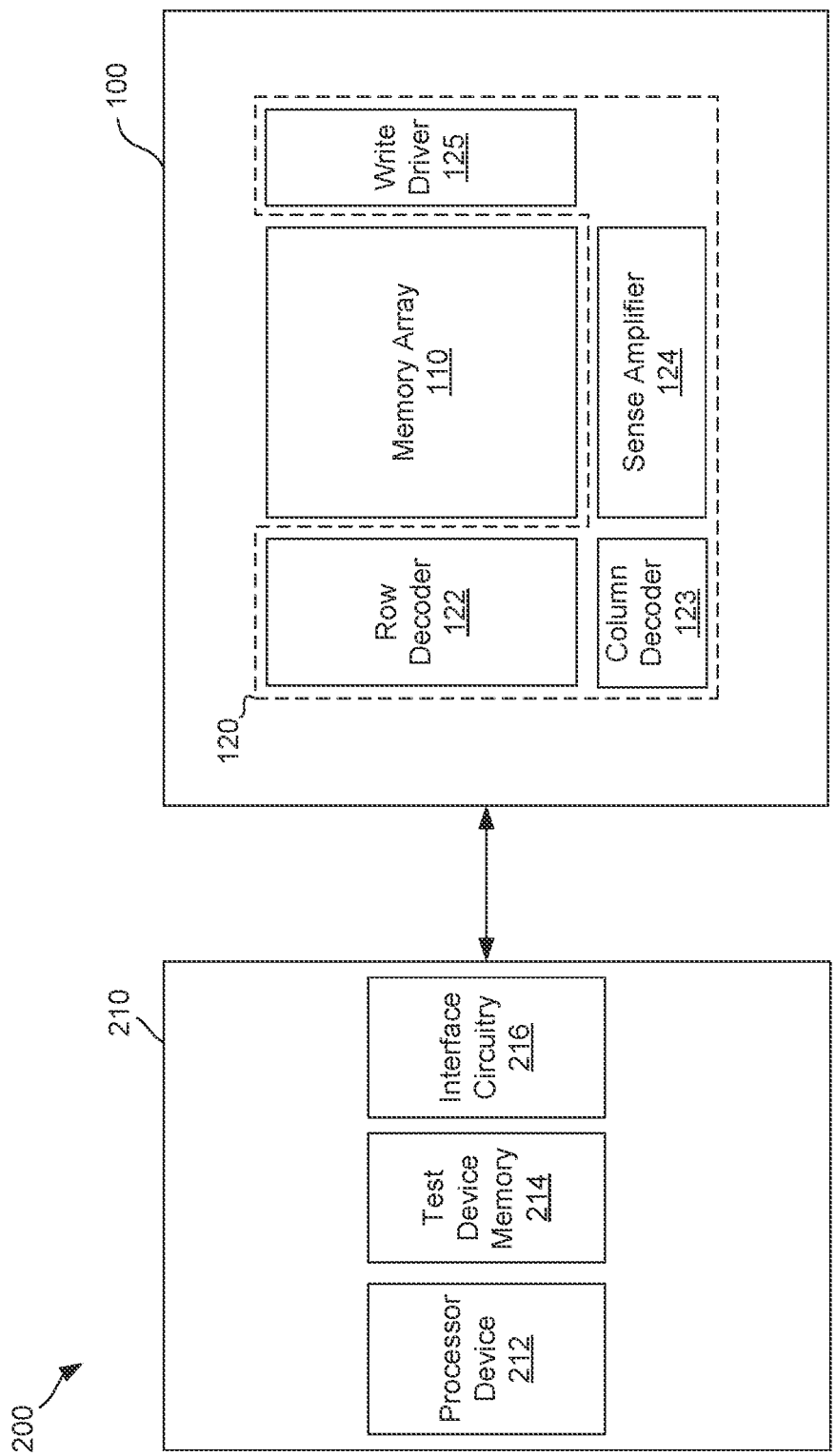
FIG. 2 illustrates a block diagram of a test system in accordance with some embodiments of the present disclosure.

FIG. 2 illustrates a test system 200, according to one or more examples. The testing system 200 includes a test control device 210 that is connected to the memory device 100. The test control device 210 communicates test processes to and receives test syndromes from the memory device 100 to detect and diagnose faults within the memory device 100.

In one example, the test system 200 is used during manufacturing to test the memory device 100. In such an example, the memory device 100 is a fully manufactured memory device 100 that is ready for inclusion with another IC device. In one example, the test system 200 communicates with built-in self-test (BIST) circuitry associated with the memory device 100 to communicate test processes to and receive test syndromes from the memory device 100.

The test control device 210 includes a processing device 212, a test device memory 214, and interface circuitry 216. The processing device 212 is configured similar to the processing device 1002 of FIG. 10. The processing device 212 obtains data associated with a test process stored within the test device memory 214 and communicates the data associated with the test process to the memory device 100 via the interface circuitry 216. The processing device 212 receives a test syndrome, or syndromes, corresponding to the test process from the memory device 100 via the interface circuitry 216. The processing device 212 compares the received test syndrome to syndrome data stored within the test device memory 214 to determine if the test syndrome matches a failure syndrome. Based on the test syndrome matching a failure syndrome, a fault type is determined. Further, parameter information (e.g., size, location, and/or orientation) for the circuit elements of the peripheral circuitry 120 and the memory array 110 is used to determine the location of the fault. The location is associated with one of the circuit elements (e.g., the row decoder circuitry 122, the column decoder circuitry 123, the sense amplifier circuitry 124, or the write driver circuitry 125) of the peripheral circuitry 120. The processing device 212 stores the fault type and location of the fault within the test device memory 214.

Figure 10:
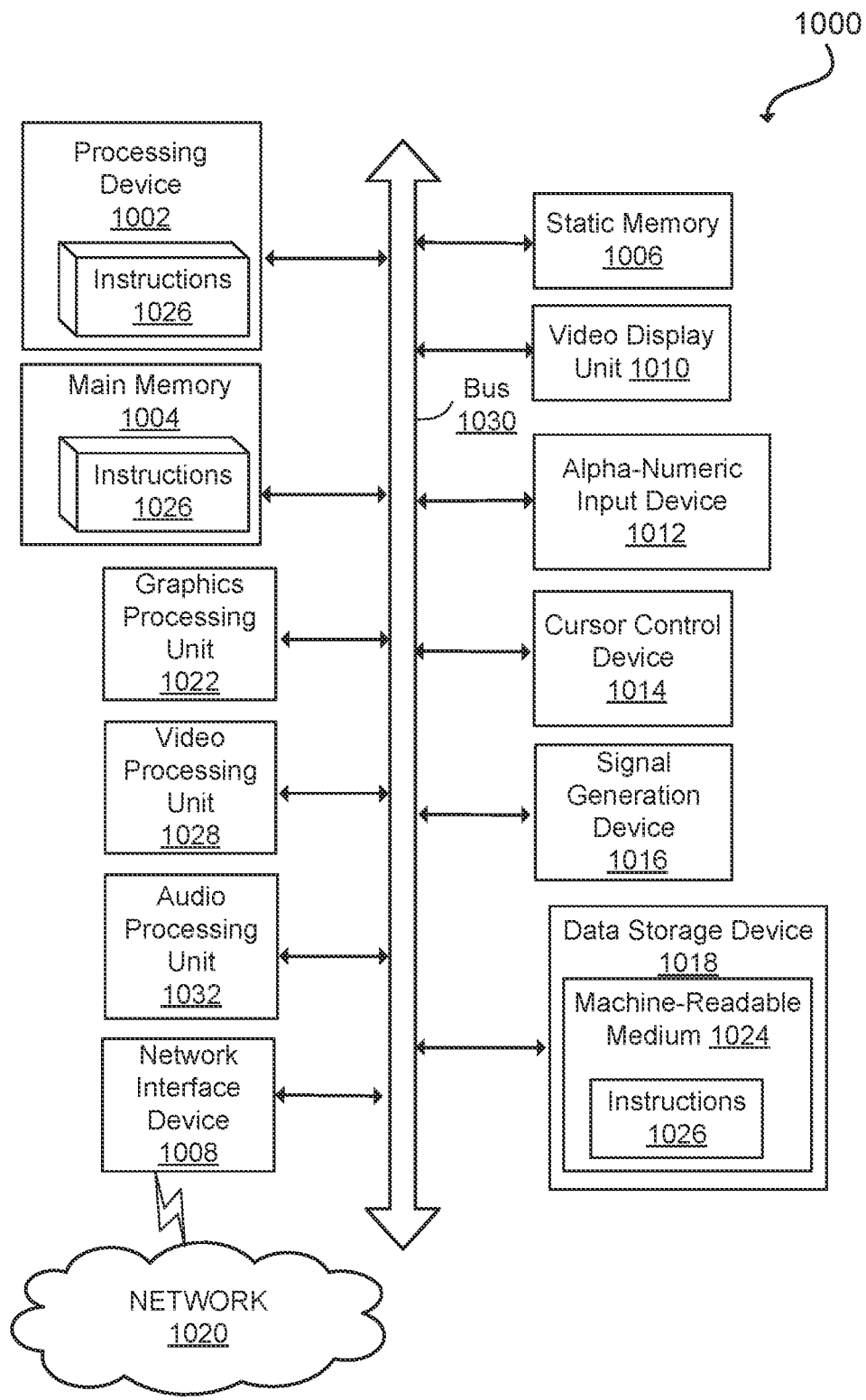
FIG. 10 depicts a diagram of an example computer system in which embodiments of the present disclosure may operate.

The test device memory 214 is configured similar to the main memory 1004 or the machine-readable storage medium 1024 of FIG. 10. The test device memory 214 stores one or more test processes and test syndrome data. In one example, the test device memory 214 stores a test process for each circuit element (e.g., the row decoder circuitry 122, the column decoder circuitry 123, the sense amplifier circuitry 124, and the write driver circuitry 125) of the peripheral circuitry 120.

The test processes include march and/or march-like test algorithms, as well as more complex test algorithms (e.g., walking algorithms, or galloping algorithms, among others). In a march test algorithm, patterns that "march" up and down the memory address are applied, while writing values to and reading values from a known memory location. A march test algorithm further takes into account parameters of the memory array 110 (e.g., the size and word length of the memory array 110, among others). A march test algorithm is used to detect and diagnose stuck-at faults, transition faults, address faults, and coupling faults among others. A transition fault corresponds to a bitcell that is unable to be transitioned from a voltage value of logic 0 to 1 or from logic 1 to 0. An address fault corresponds to a memory address that cannot be accessed, no address from which a particular word can be accessed, with a certain address, multiple words can be accessed simultaneously, and a word is accessed with multiple addresses. A coupling fault is a fault that occurs in a bitcell due to an erroneous coupling with another bitcell.

The interface circuitry 216 is connected to the memory device 100 via one or more wires (or connections). The interface circuitry 216 communicates data to and receives data from the memory device 100. In one example, the interface circuitry 216 is connected to interface circuitry within the memory device 100.

Figure 3:
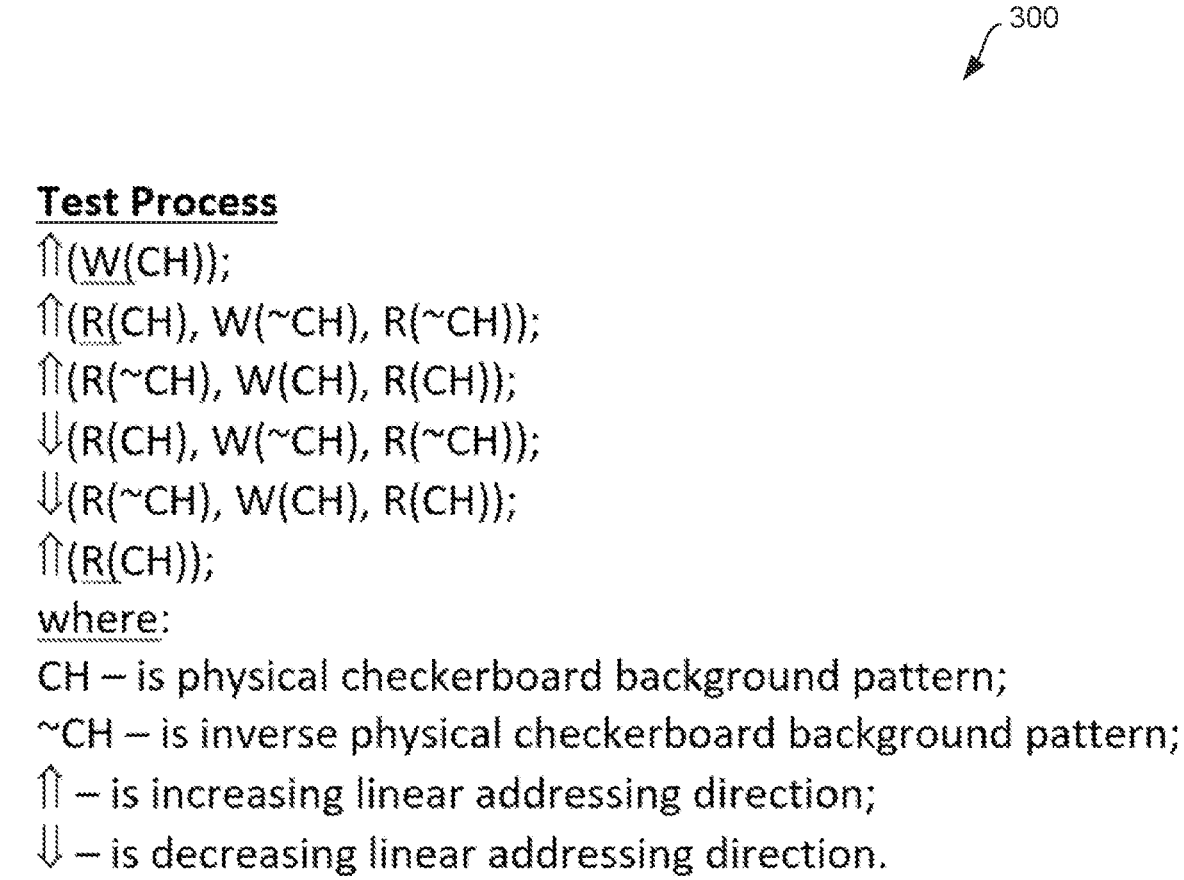
FIG. 3 illustrates an example test process in accordance with some embodiments of the present disclosure.

FIG. 3 illustrates an example test process 300, according to one or more examples. The test process 300 is stored within the test device memory 214. The test process 300 is used to diagnose faults within address decoder circuitry (e.g., the address decoder circuitry 121 of FIG. 1). In the test process 300, "⇑" indicates an increasing linear address direction, "⇓" indicates a decreasing linear address direction, "W" indicates a memory write command, "R" indicates a memory read command, "CH" indicates a physical checkerboard background pattern, and "~CH" indicates an inverse physical checkerboard background pattern. In one example, a checkerboard background pattern includes a pattern of alternating 0's and 1's that are written into alternating cells.

FIG. 4 illustrates a table 400 of test syndromes generated for faults associated with the test process 300 of FIG. 3. For example, the syndromes of table 400 are generated for a fault of "wordline is stuck-at 0 (SA0)," "wordline is stuck-at 1 (SA1)," "one wordline activates two rows (1W2R)," and "One row is activated by two wordlines (1R2 W)." In other examples, other faults may be used to generate other syndromes. In the table 400, the syndromes correspond to values readout from the selected bitcells. In a SA0 fault, a wordline is erroneously stuck (e.g., held or maintained) at a voltage value of 0. In a SA1 fault, a wordline is erroneously stuck (e.g., held or maintained) at a voltage value of 1. In a 1W2R fault, activating a first wordline erroneously activates two rows of bitcells. Accordingly, a bitcell may be written to or read from erroneously. In a 1R2 W fault, a row of bitcells is activated by two different wordlines.

As illustrated in the table 400, different combinations of test syndromes associated with various wordlines indicate different types of faults (e.g., defects). In one example with reference to FIG. 2, the table 400 is stored within the test device memory 214. In such an example, the processing device 212 compares test syndromes received from the memory device 100 with the test syndromes of the table 400 to diagnose a fault (e.g., defect).

Figure 5:
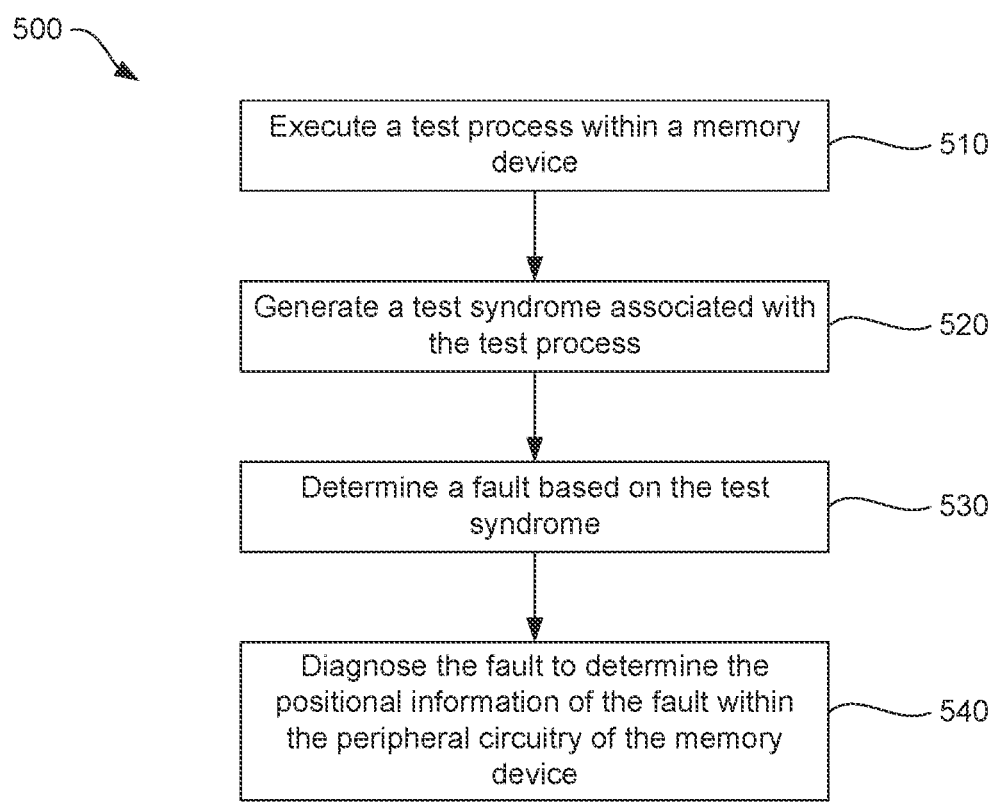
FIG. 5 illustrates a flowchart of a method for diagnosing a fault in accordance with some embodiments of the present disclosure.

FIG. 5 illustrates a flowchart of a method 500 for testing a memory device, according to one or more examples. The method 500 may be performed by the test system 200 of FIG. 1. The method 500 may be performed as part of the package and assembly process 938 of FIG. 9. At 510, a test process is executed within a memory device. For example, with reference to FIG. 2, the memory device 100 executes a test process. The test process is obtained from the test device memory 214 by the processing device 212 and output to the memory device 100 via the interface circuitry 216. The test process is used to diagnose faults associated with one or more circuit elements of the peripheral circuitry 120 of the memory device 100. For example, the test process is used to diagnose faults associated with the row decoder circuitry 122, the column decoder circuitry 123, the sense amplifier circuitry 124, and/or the write driver circuitry 125.

The test process is defined by a series of memory write commands and/or memory read commands, and associated data. In one or more examples, the test process is executed by BIST circuitry associated with the memory device (e.g., the memory device 100 of FIG. 1). In one example, the row decoder circuitry 122, the column decoder circuitry 123, and the write driver circuitry 125 perform memory write commands based on the test process. Further, the row decoder circuitry 122, the column decoder circuitry 123, and the sense amplifier circuitry 124 perform memory read commands based on the test process. FIG. 3 illustrates example test processes that can be used to test the functionality of the address decoder circuitry 121.

At 520, a test syndrome associated with the test process is generated. In one example with reference to FIG. 2, the memory device 100 outputs a test syndrome based on executing the test process. For example, the memory device 100 performs one or more memory write commands and/or one or more memory read commands based on test process, and outputs the corresponding test syndrome (or syndromes) to the test control device 210. The order and number of the memory write commands and memory read commands corresponds to the test process. In one example, one or more memory write commands are performed before a memory read command. In one example, the row decoder circuitry 122, the column decoder circuitry 123, and the sense amplifier circuitry 124 generate a test syndrome (or syndromes) based on the test process. The test syndrome is a series of logic values of 0's and/or 1's. For example, a test syndrome may be a series of all 0's, all 1's, or a combination of 0's and 1's. The test syndrome indicates the result of the memory read operations of the corresponding test process. The number of bits in a test syndrome corresponds to the number of memory read operations in the test process. A value of 0 in a test syndrome indicates no mismatch during comparison and a value of 1 corresponds to a mismatch during comparison. In one example, the output value of a memory read operation is compared to an expected value. In one example, BIST circuitry is configured to compare the output value with the expected value to determine whether or not the output value is the same as the expected value. Based on the comparison indicating that the output value does not match the expected value, a value of 1 is generated. Based on the comparison indicating that the output value does matches the expected value, a value of 0 is generated.

At 530, a fault is determined based on the test syndrome. For example, with reference to FIG. 2, the processing device 212 determines the type of fault by comparing the test syndrome received from the memory device 100 to test syndrome data within the test device memory 214. In one example, the processing device 212 compares the test syndrome to a table (e.g., the table 400 of the FIG. 4) to determine the fault.

At 540, the fault is diagnosed to determine the location of the fault within the peripheral circuitry of the memory device. For example, with reference to FIG. 2, the test system 200 diagnoses the detected fault to determine the location of the fault with regard to the peripheral circuitry 120 and the memory array. In one example, the location of the fault corresponds to a location associated with one or more of the circuit elements (e.g., the row decoder circuitry 122, the column decoder circuitry 123, the sense amplifier circuitry 124 or the write driver circuitry 125) of the peripheral circuitry 120.

In one example, diagnosing the location of the fault is based on parameters of the memory device (e.g., the memory device 100 of FIG. 2). In one example, the memory parameters of the memory device include a number of words, a number of bits per word, column multiplexing, bitcell height, and bitcell width. Further, the type of memory scrambling applied to the memory device is used during diagnosis. Memory scrambling corresponds to the difference between how address sequences and data patterns appear external to a memory device and internal to a memory device. Additionally, or alternatively, the orientation, physical position, and size of each of the circuit elements of the peripheral circuitry is used to diagnose a detected fault. The orientation is a horizontal or vertical orientation. In one example, the orientation is associated with the orientation of the memory array.

In one example, the diagnosed fault (e.g., the type of fault and location of fault) is stored in the test device memory 214 of FIG. 2. Additionally, or alternatively, the diagnosed fault is output from the test control device 210. The diagnosed fault may be output from the test control device 210 to another computing system. The diagnosed fault is used to correct an error within the circuit design of the memory device 100. For example, a designer may use the diagnosed fault to correct the error within circuit design. In another example, the circuit design is corrected by a computing system based on the diagnosed fault.

Figure 6:
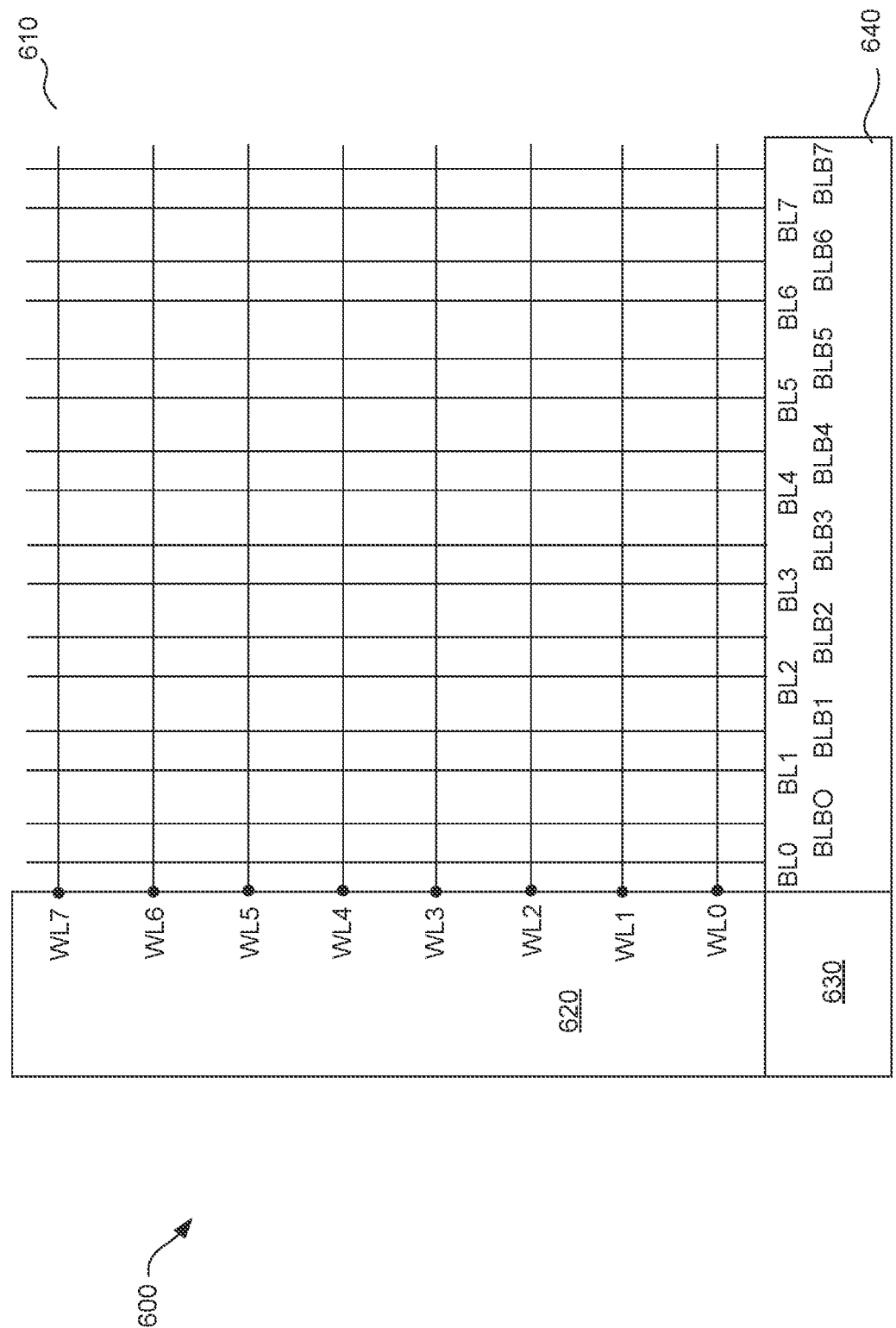
FIG. 6 illustrates a block diagram of a portion of a memory device in accordance with some embodiments of the present disclosure.

FIG. 6 illustrates a portion of a memory device 600. The memory device 600 includes memory array 610, row decoder circuitry 620, column decoder circuitry 630, and input/output circuitry 640. The input/output circuitry 640 includes sense amplifier circuitry and write driver circuitry. The memory array 610 includes wordlines WL0-WL7, bitlines BL0-BL7 and BLB0-BLB7, and bitcells. Each bitcell is connected to a wordline and a pair of bitlines (e.g., one of the bitlines BL0-BL7 and one of the bitlines BLB0-BLB7). Each wordline is associated with a row of bitcells. Each pair of bitlines (e.g., one of the bitlines BL0-BL7 and one of the bitlines BLB0-BLB7) is associated with a column of bitcells. The row decoder circuitry 620 is connected to the wordlines and activates the wordlines to select a row of bitcells to be read from or updated (e.g., written to). The input/output circuitry 640 is connected to the bitlines BL0-BL7 and BLB0-BLB7 to read a value from or write a value to the selected bitcell. In one example, the input/output circuitry 640 is connected to multiplexers that are each connected to two or more of the bitlines BL0-BL7 and two or more of the BLB0-BLB7.

In one example, to detect a SA0 fault at WL1 (e.g., a fault where the bitcells connected to WL1 are never selected to be accessed), the corresponding test process fails at addresses 4, 5, 6, 7, which correspond to the physical row 1 of bitcells. In one example, the address is for a memory device that employs a column multiplexing scheme of 4, and there are 4 addresses or memory words per wordline or row. The test syndrome output is 101010100. In the test syndrome, the first, third, fifth, and seventh memory read operations of the test process fail (e.g., do not produce the expected data). For the first and third memory read operations of the test process, the expected data is 000000000, and the received data is 11111111. For the third and seventh memory read operations of the test process, the expected data is 11111111, and the received data is 00000000. Further, failure is reported on all of the input/output circuitry 640, indicating that the error is a row decoder circuitry fault (e.g., fault within the row decoder circuitry 122 of FIG. 2). The test syndrome is compared to test syndrome data to determine the fault type. In one example, based on comparing the test syndrome to the test syndrome table, an SA0 fault is determined at WL0. Further, based on the dimensions (e.g., size parameter) of the bitcell, and the dimensions of the circuit elements, the location (e.g., XY coordinates) of the fault are determined. For example, as the SA0 fault is occurring at the wordline WL0, the location of the fault corresponds to where the wordline WL0 is connected to and driven by the row decoder circuitry 620. The wordline is connected to the top of each of bitcell within the corresponding row. Accordingly, using the dimension of the bitcells, the location of the wordline WL0 is determined. Further, using orientation and size parameters of the circuit elements, the location of where the wordline WL0 is connected to the row decoder circuitry 620 is determined. This location may be reported as the location information of the fault.

Figure 7B:
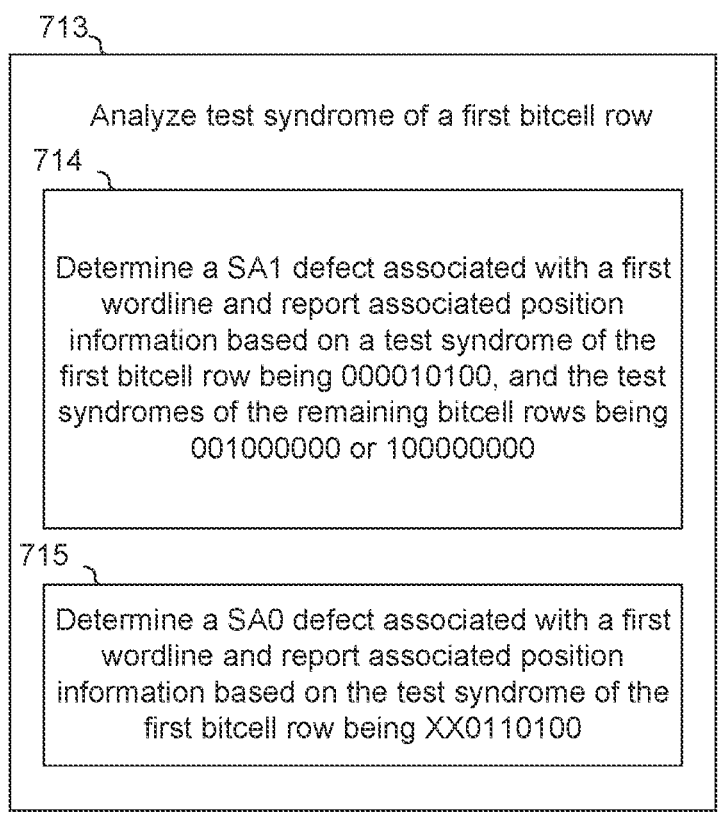

FIG. 7A illustrates a flowchart of a method 700 for diagnosing faults within a memory device, according to one or more examples. In one example, the method 700 is performed by the test system 200 of FIG. 2. The method 700 illustrates an example diagnostic flow to diagnose address decoder circuitry faults (e.g., faults within the row decoder circuitry 122 OF FIG. 2 and/or the column decoder circuitry 123 of FIG. 2).

At 710, test syndromes for an executed test process are received. In one example, with reference to FIG. 2, the test process is obtained by the processing device 212 from the test device memory 214, and communicated to the memory device 100 via the interface circuitry 216. The peripheral circuitry 120 and the test process is executed on the memory array 110, which generates the test syndromes. For example, executing the test process includes executing one or more memory write commands and one or more memory read commands of the test process. In one example, the test processes are executed by BIST circuitry associated with the memory device 100 of FIG. 1. The memory write commands write data bitcells of the memory array 110 based on data of the test process. In one example, the number of memory write commands, the data written to the bitcells, and/or the bitcells selected to be written corresponds to the test process, and may differ between test processes.

At 711, a determination as to whether or not a failure is detected in N data bits of the test syndromes is made. N is one or more. In one example, N is set to be at least half of the number of data bits. In another example, N is set to be all of the data bits. Based on a detection of no failure within N data bits of the test syndromes, at 712, a determination that a fault is not associated with the address decoder circuitry (e.g., the row decoder circuitry 122 of FIG. 2 and/or the column decoder circuitry 123) is made.

Based on a determination of a failure of the N data bits within the test syndromes at 711, at 713, the test syndrome of a first bitcell row is analyzed. For example, with reference to FIG. 6, the test syndrome is associated with the row of bitcells connected to the wordline WL0. In one example, analyzing the test syndrome of the first bitcell row includes at 714 of FIG. 7B, determining a SA1 fault associated with a first wordline, and report coordinates based on the test syndrome associated with the first bitcell row being 000010100, and the test syndromes of second and third bitcell rows being 001000000 or 100000000, as shown in FIG. 4. For example, with reference to FIG. 6, the first bitcell row is associated with wordline WL0 and the remaining bitcell rows are respectively associated with wordlines WL1-WL7. The fault is determined to be a stuck-at-1 defect, and the location of the fault is the output pin of the row decoder circuitry 620 that drives the wordline WL0. The location of the fault is output as a two-dimensional position that is associated with the connection of the output pin of the row decoder circuitry 620 and the first wordline WL0. Additionally, or alternatively, analyzing the test syndrome of the first bitcell row includes at 715 of FIG. 7B, determining a SA0 fault associated with a first wordline, and report associated positional information based on the test syndrome associated with the first bitcell row being XX0110100, as shown in FIG. 4. "XX" indicates a value of 0 or 1. For example, with reference to FIG. 6, the first bitcell row is associated with wordline WL0, the fault is determined to be a SA0 defect, and the location of the fault is the output pin of the row decoder circuitry 620 that drives the wordline WL0. The location information of the fault is output as a two-dimensional position that is associated with the connection of the output pin of the row decoder circuitry 620 and the first wordline WL0.

In one example, 714 and 715 are performed in any order. For example, 714 may be performed before, after, and/or during an at least partially overlapping period with 715.

Figure 7C:
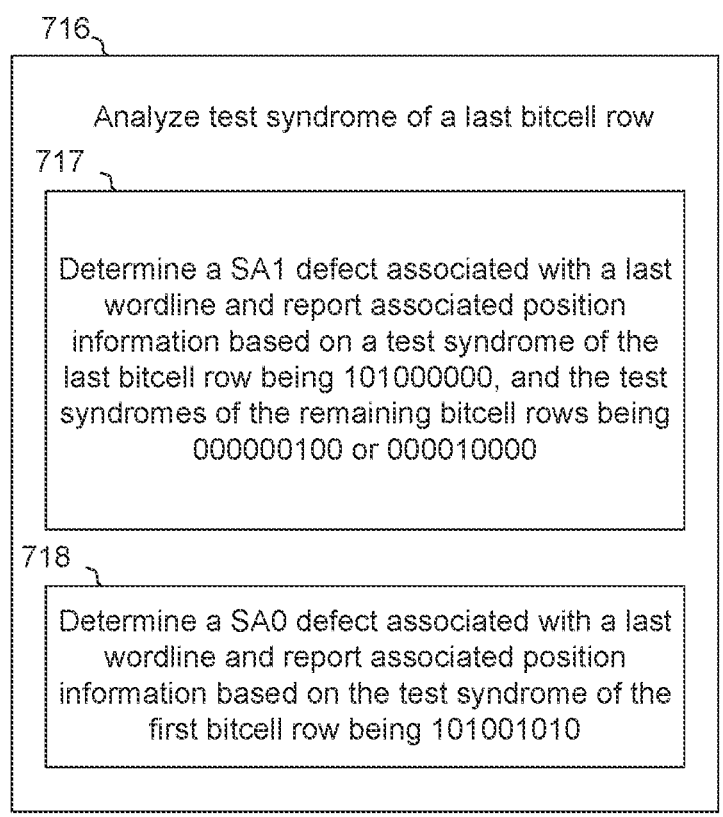

With further reference to FIG. 7, at 716, the test syndrome of a last bitcell row is analyzed. For example, with reference to FIG. 6, the test syndrome associated with the row of bitcells associated with wordline WL7 (e.g., the row of bitcells that is farthest from the input/output circuitry 640) is analyzed. With reference to FIG. 6, the test syndrome associated with the wordline WL7 is analyzed. Analyzing the test syndrome of the last bitcell row includes at 717 of FIG. 7C, determining a SA1 fault associated with a last wordline, and report positional information based on the test syndrome associated with the first bitcell row being 101000000, and the test syndromes of the remaining bitcell rows being 000000100 or 0000100000, as shown in FIG. 4. For example, with reference to FIG. 6, the last bitcell row is associated with wordline WL7, and the remaining bitcells rows are associated with wordlines WL0-WL6. The fault is determined to be a SA1 defect, and the location of the fault is the output pin of the row decoder circuitry 620 that drives the wordline WL7. The location of the fault is output as a two-dimensional position that is associated with the connection of the output pin of the row decoder circuitry 620 and the wordline WL7. Additionally, or alternatively, analyzing the test syndrome of the first bitcell row includes at 718 of FIG. 7C, determining a SA0 fault associated with a first wordline, and reporting associated positional information based on the test syndrome associated with the last bitcell row being 101001010. For example, with reference to FIG. 6, the last bitcell row is associated with wordline WL7, the fault is determined to be a SA0 defect, and the location of the fault is the output pin of the row decoder circuitry 620 that drives the wordline WL7. The location information of the fault is output as a two-dimensional position that is associated with the connection of the output pin of the row decoder circuitry 620 and the first wordline WL7.

In one example, 717 and 718 are performed in any order. For example, 717 may be performed before, after, and/or during an at least partially overlapping period with 718.

With further reference to FIG. 7A, at 719, the test syndrome of an "i" bitcell row is analyzed. The value of "i" is one or more. In one example, "t" is the number of bitcell rows. In such an example, "i" is in the range of "1 to t−2". In one example, analyzing the test syndrome of the "i" bitcell row includes at 720 of FIG. 7D, determining an SA1 defect associated with a corresponding wordline, and report positional information based on the test syndrome associated with the "i" bitcell row being 101010100, the test syndromes of the "i+1" to "t−1" bitcell rows being 001000000 or 100000000, and the test syndromes of the 0 to i−1 bitcells rows being 000000100 or 000010000. For example, with reference to FIG. 6, the number of bitcell rows corresponds to the number of wordlines WL0-WL7 (e.g., 8 wordlines). In one example with reference to FIG. 6, the "i" bitcell row is associated with wordline WL3, the "i+1" to "t−1" bitcells rows are associated with wordlines WL4-WL7, and the 0 to "i−1" bitcell rows are associated with wordlines WL0-WL2.

Additionally, or alternatively, analyzing the test syndrome of the "i" bitcell row includes at 721, determining a 1W2R fault and report associated positional information based on the test syndrome of the "i" bitcell row being 000010000 or 000000100, and the test syndrome of the "i+1" bitcell row is 101000000. In one example with reference to FIG. 6, the "i" bitcell row is associated with wordline WL2, and the "i+1" bitcell row is associated with wordline WL3.

Additionally, or alternatively, analyzing the test syndrome of the "i" bitcell row includes at 722, determining, for an "i+1" bitcell row, a 1W2R fault and report associated positional information based on the test syndrome of the "i" bitcell row being 101000000, and the test syndrome of the "i+1" bitcell row is 100000000 or 001000000. In one example with reference to FIG. 6, the "i" bitcell row is associated with wordline WL2, and the "i+1" bitcell row is associated with wordline WL3.

Additionally, or alternatively, analyzing the test syndrome of the "i" bitcell row includes at 723, determining, for an "i+1" bitcell row, a 1R2 W fault and report associated positional information based on the test syndrome of the "i" bitcell row being 000010100, and the test syndrome of the "i+1" bitcell row being 101000000. In one example with reference to FIG. 6, the "i" bitcell row is associated with wordline WL2, and the "i+1" bitcell row is associated with wordline WL3.

Additionally, or alternatively, analyzing the test syndrome of the "i" bitcell row includes at 724, determining, for the "1" bitcell row, an SA0 fault and report associated positional information based on the test syndrome of the "i" bitcell row being 101010100. In one example with reference to FIG. 6, the "i" bitcell row is associated with wordline WL2, and SA0 is determined to be associated with WL2.

In one example, the order in which 720, 721, 722, 723, and 724 differs from that illustrated in FIG. 7D. In one or more examples, two or more of 720, 721, 722, 723, and 724 may be performed during at least partially overlapping periods.

In one example, 713 of FIG. 7A is performed before 716 of FIG. 7A, and 716 of FIG. 7A is performed before 719 of FIG. 7A. In one or more examples, two or more of 713, 716, and 719 may at least partially overlap.

Figure 8:
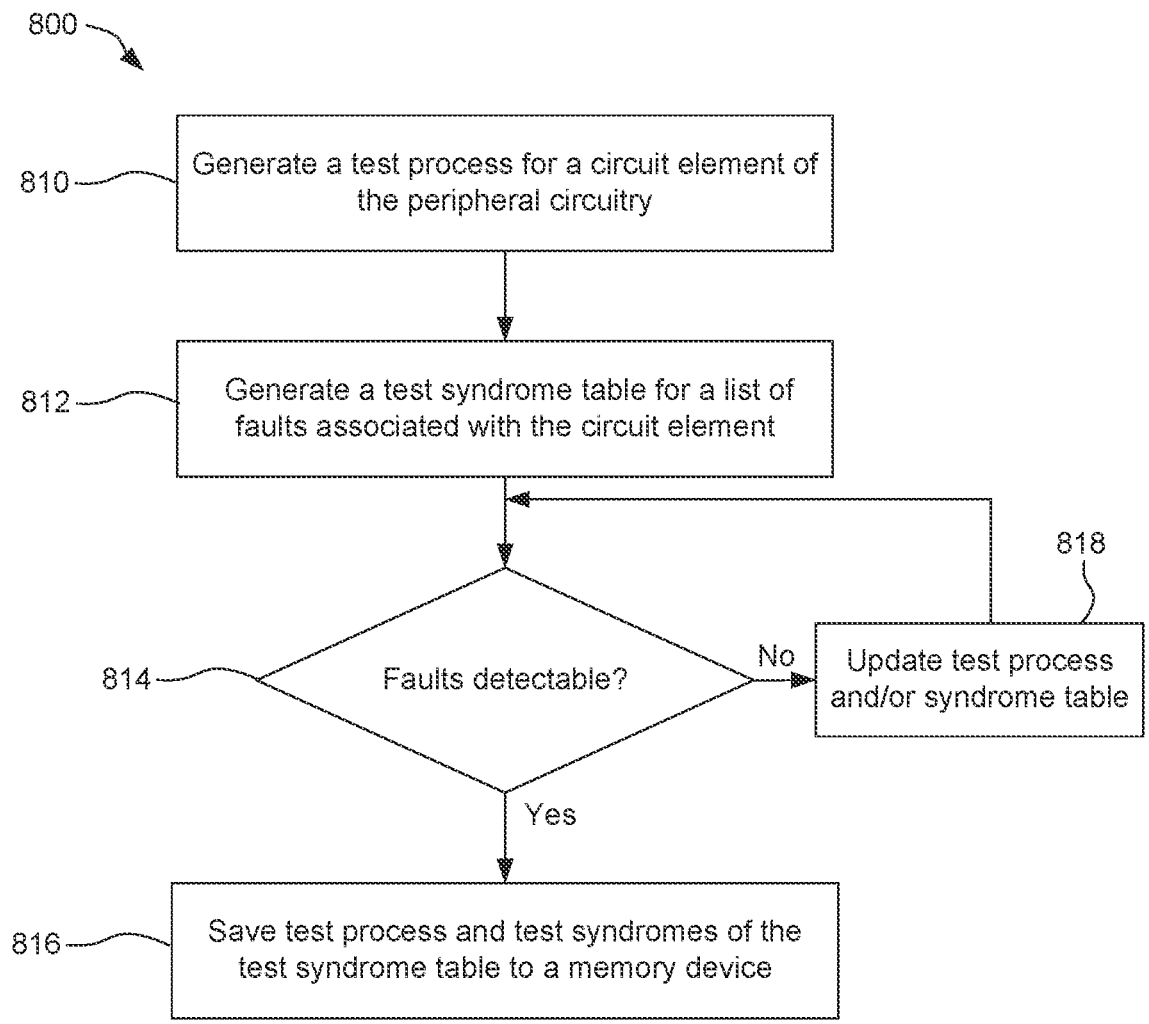
FIG. 8 illustrates a flowchart of a method for generating a test process and test syndrome data in accordance with some embodiments of the present disclosure.

FIG. 8 illustrates a flowchart of a method 800 for generating test processes. In one example, FIG. 8 is performed by a processing system (e.g., the test control device 210 of FIG. 2 or the computer system 1000 of FIG. 10).

At 810, a test process of a circuit element of peripheral circuitry is generated. In one example, a processing device (e.g., the processing device 212 of FIG. 2 or the processing device 1002 of FIG. 10) generates the test process for the circuit element. A test process associated with one of the row decoder circuitry 122, the column decoder circuitry 123, the sense amplifier circuitry 124, and the write driver circuitry 125 is determined. The test process includes one or more checkerboard tests and/or one or more march (walk or galloping) tests, among others.

At 812, a test syndrome table is generated for a list of faults associated with the circuit element. In one example, a processing device (e.g., the processing device 212 of FIG. 2 or the processing device 1002 of FIG. 10) generates the test syndrome table for the list of faults for the circuit element. The test syndrome table includes one or more test syndromes associated with one or more faults. In one example, for each fault a corresponding test syndrome is generated. The test syndrome includes data bits that are indicative of an occurrence of the fault.

At 814, a determination as to whether or not the faults are detectable is made. In one example, a processing device (e.g., the processing device 212 of FIG. 2 or the processing device 1002 of FIG. 10) determines whether or not the faults are detectable. For example, a determination as to whether or not each of the faults are independently detectable from the test syndromes within the test syndrome table is made. A determination that the faults are not independently detectable is made based on determining that two test syndromes within the test syndrome table have the same value. Further, a determination that the faults are independently detectable is made based on determining that each of the test syndromes within the test syndrome table have different values.

At 816, the test process and test syndromes of the test syndrome table are saved within a memory device. In one example, a processing device (e.g., the processing device 212 of FIG. 2 or the processing device 1002 of FIG. 10) saves the test process and test syndromes of the test syndrome table within a memory device (e.g., the test device memory 214 of FIG. 2, the main memory 1004 of FIG. 10, or the machine-readable storage medium 1024 of FIG. 10).

At 818, the test process and/or syndrome table is updated based on a determination at 814 that not all the faults are detectable. In one example, a processing device (e.g., the processing device 212 of FIG. 2 or the processing device 1002 of FIG. 10) updates the test process and/or syndrome table. In one example, updating the test process includes adjusting one or more of the memory read commands and/or memory write commands. For example, the order of the read and memory write commands is adjusted, values written during a memory write command are adjusted, and/or the wordlines selected during memory read commands and/or memory write commands are adjusted, among others. Additionally, or alternatively, the test syndromes of the test syndrome table are updated. For example, for one or more faults, a data bit, or bits, of the test syndrome is adjusted. At the completion of 818, 814 is performed to determine whether or not all of the faults are independently detectable.

Figure 9:
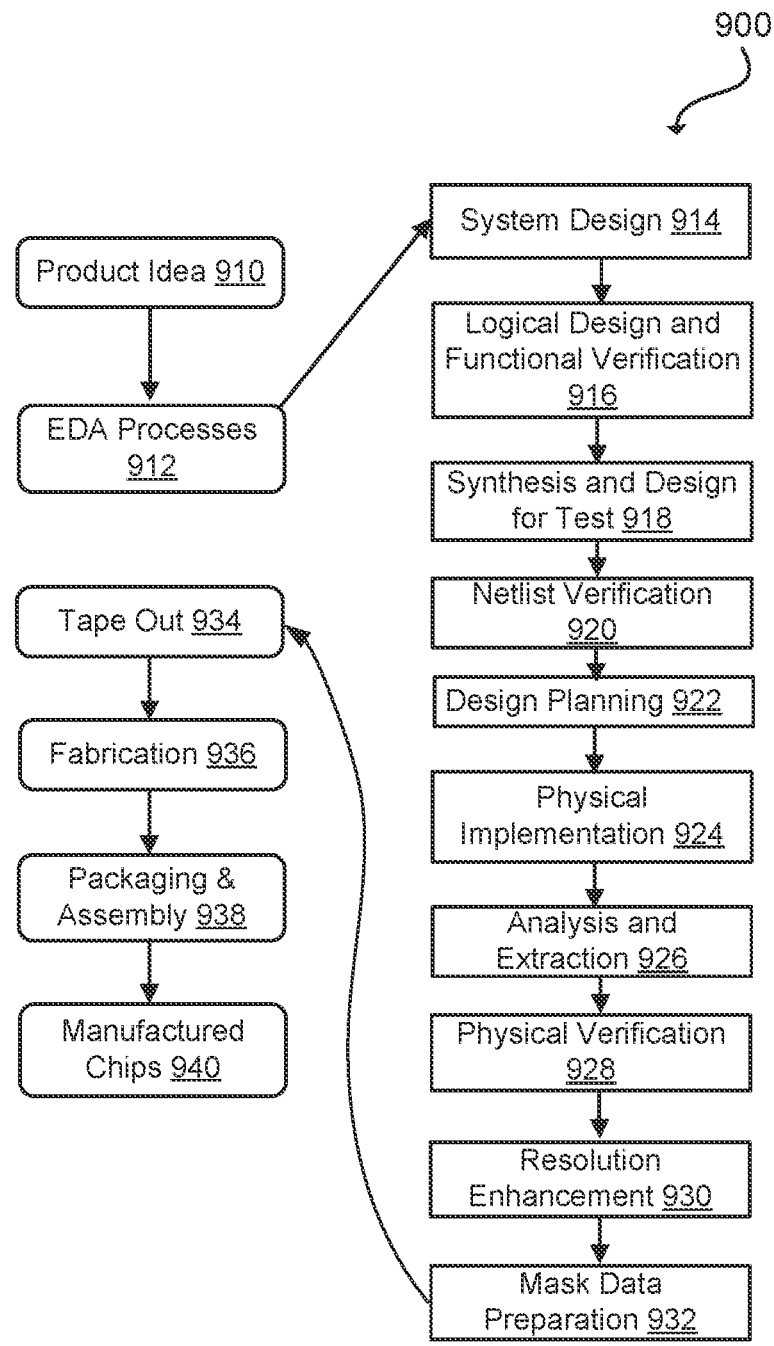
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 9. The processes described by be enabled by EDA products (or EDA systems).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving, at a test device, a first test syndrome from a memory device, the first test syndrome corresponds to a first test process executed by the memory device, wherein the memory device comprises a memory array and peripheral circuitry, the peripheral circuitry comprises a first circuit element external to and coupled with the memory array and configured to perform at least a portion of a memory command associated with the memory array, and wherein the first test process is associated with the first circuit element;
   determining, by a processing device of the test device, a first fault associated with the first circuit element based on the first test syndrome; and
   diagnosing, by the processing device, the first fault to determine positional information of the first fault, the positional information is associated with the first circuit element.

2. The method of claim 1, wherein the first test process includes one or more memory write commands and memory read commands.

3. The method of claim 1, wherein determining the first fault associated with the first circuit element based on the first test syndrome comprises:
   comparing the first test syndrome to a plurality of test syndromes of a test syndrome table associated with the first circuit element; and
   determining the first fault based on determining that the first test syndrome matches one of the plurality of test syndromes.

4. The method of claim 1, wherein the positional information includes a location where the first circuit element is connected to the memory array, and wherein diagnosing the first fault to determine the positional information is based on location information of the peripheral circuitry relative to the memory array.

5. The method of claim 1 further comprising receiving a second test syndrome, and wherein determining the first fault associated with the first circuit element is further based on the second test syndrome.

6. The method of claim 1 further comprising storing the first fault and the positional information of the first fault within a memory.

7. The method of claim 1 further comprising:
receiving a second test syndrome, determining a second fault associated with a second circuit element of the peripheral circuitry based on the second test syndrome; and
diagnosing the second fault to determine positional information of the second fault.

8. A test device comprising:
a memory storing instructions; and
a processing device, coupled with the memory and to execute the instructions, the instructions when executed cause the processing device to:
output a first test process to a memory device, wherein the memory device comprises a memory array and peripheral circuitry, the peripheral circuitry comprises a first circuit element external to and coupled with the memory array and configured to perform at least a portion of a memory command associated with the memory array, wherein the first test process is associated with the first circuit element, and wherein the first test process is executed by the peripheral circuitry and memory to generate a first test syndrome;
receive the first test syndrome from the memory device;
determine a first fault associated with the first circuit element based on a comparison of the first test syndrome to a plurality of test syndromes; and
diagnose the first fault to determine positional information of the first fault based on location information of the memory array and the peripheral circuitry.

9. The test device of claim 8, wherein the first test process includes one or more memory write commands and one or more memory read commands.

10. The test device of claim 8, wherein determining the first fault associated with the first circuit element based on the first test syndrome comprises:
determining the first fault based on determining that the first test syndrome matches one of the plurality of test syndromes.

11. The test device of claim 8, wherein the positional information includes a location associated with where the first circuit element is connected to the memory array.

12. The test device of claim 8, wherein the processing device is further caused to receive a second test syndrome, and wherein determining the first fault associated with the first circuit element is further based on the second test syndrome.

13. The test device of claim 8, wherein the processing device is further caused to store the first fault and the positional information of the first fault within a memory.

14. The test device of claim 8, wherein the processing device is further caused to:
receive a second test syndrome,
determine a second fault associated with a second circuit element of the peripheral circuitry based on the second test syndrome; and
diagnose the second fault to determine positional information of the second fault.

15. A non-transitory computer readable medium comprising stored instructions, which when executed by a processor, cause the processor to:
receive a first test syndrome from a memory device, the first test syndrome corresponds to a first test process executed by the memory device, wherein the memory device comprises a memory array and peripheral circuitry, the peripheral circuitry comprises a first circuit element external to and coupled with the memory array and configured to perform at least a portion of a memory command associated with the memory array, and wherein the first test process is associated with the first circuit element of the peripheral circuitry;
determine a first fault associated with the first circuit element based on the first test syndrome; and
diagnose the first fault to determine positional information of the first fault, the positional information is associated with the first circuit element.

16. The non-transitory computer readable medium of claim 15, wherein the first test process includes one or more memory write commands and one or more memory read commands.

17. The non-transitory computer readable medium of claim 15, wherein determining the first fault associated with the first circuit element based on the first test syndrome comprises:
comparing the first test syndrome to a plurality of test syndromes of a test syndrome table associated with the first circuit element; and
determining the first fault based on determining that the first test syndrome matches one of the plurality of test syndromes.

18. The non-transitory computer readable medium of claim 15, wherein the positional information includes a location associated with where the first circuit element is connected to the memory array, and wherein diagnosing the first fault to determine the positional information is based on location information of the memory array and the peripheral circuitry.

19. The non-transitory computer readable medium of claim 15, wherein the processor is further caused to receive a second test syndrome, and wherein determining the first fault associated with the first circuit element is further based on the second test syndrome.

20. The non-transitory computer readable medium of claim 15, wherein the processor is further caused to:
receive a second test syndrome,
determine a second fault associated with a second circuit element of the peripheral circuitry based on the second test syndrome; and
diagnose the second fault to determine positional information of the second fault.

* * * * *